(12) United States Patent
Chen et al.

(10) Patent No.: US 7,682,963 B2
(45) Date of Patent: Mar. 23, 2010

(54) AIR GAP FOR INTERCONNECT APPLICATION

(75) Inventors: Hai-Ching Chen, Hsinchu (TW); Sunil Kumar Singh, Hsin-Chu (TW); Tien-I Bao, Hsin-Chu (TW); Shau-Lin Shue, Hsinchu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 334 days.

(21) Appl. No.: 11/867,308

(22) Filed: Oct. 4, 2007

(65) Prior Publication Data

US 2009/0091038 A1 Apr. 9, 2009

(51) Int. Cl.
*H01L 21/4763* (2006.01)

(52) U.S. Cl. .............. 438/619; 257/E21.581; 438/421

(58) Field of Classification Search .......... 257/E21.581; 438/421, 619
See application file for complete search history.

(56) References Cited

U.S. PATENT DOCUMENTS

| | | | |
|---|---|---|---|
| 7,125,782 B2 | 10/2006 | Knorr et al. | |
| 2005/0037604 A1* | 2/2005 | Babich et al. | 438/619 |
| 2006/0081830 A1 | 4/2006 | Knorr et al. | |

* cited by examiner

*Primary Examiner*—Asok K Sarkar
(74) *Attorney, Agent, or Firm*—Haynes and Boone, LLP

(57) ABSTRACT

The present disclosure provides a method for fabricating an integrated circuit. The method includes forming an energy removable film (ERF) on a substrate; forming a first dielectric layer on the ERF; patterning the ERF and first dielectric layer to form a trench in the ERF and the first dielectric layer; filling a conductive material in the trench; forming a ceiling layer on the first dielectric layer and conductive material filled in the trench; and applying energy to the ERF to form air gaps in the ERF after the forming of the ceiling layer.

19 Claims, 9 Drawing Sheets

US 7,682,963 B2

AIR GAP FOR INTERCONNECT APPLICATION

BACKGROUND

In semiconductor technology, an integrated circuit can be formed on a semiconductor substrate according to a particular technology node, which typically indicates a minimum feature size. When the minimum feature size moves to about 100 nm or below, damascene processes are frequently utilized to form multilayer copper interconnections including vertical interconnection vias and horizontal interconnection metal lines. In such damascene processes, it is often desirable to use low dielectric constant (low-k) materials to form interlayer dielectrics. One way to form such low-k dielectric materials is to provide air gaps in the material. However, one concern is that the air gap can collapse in large spacing regions, thereby causing performance and quality issues of the integrated circuit. Therefore, what is needed is a structure with reduced air gap collapse and improved performance, and a method of making the same.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
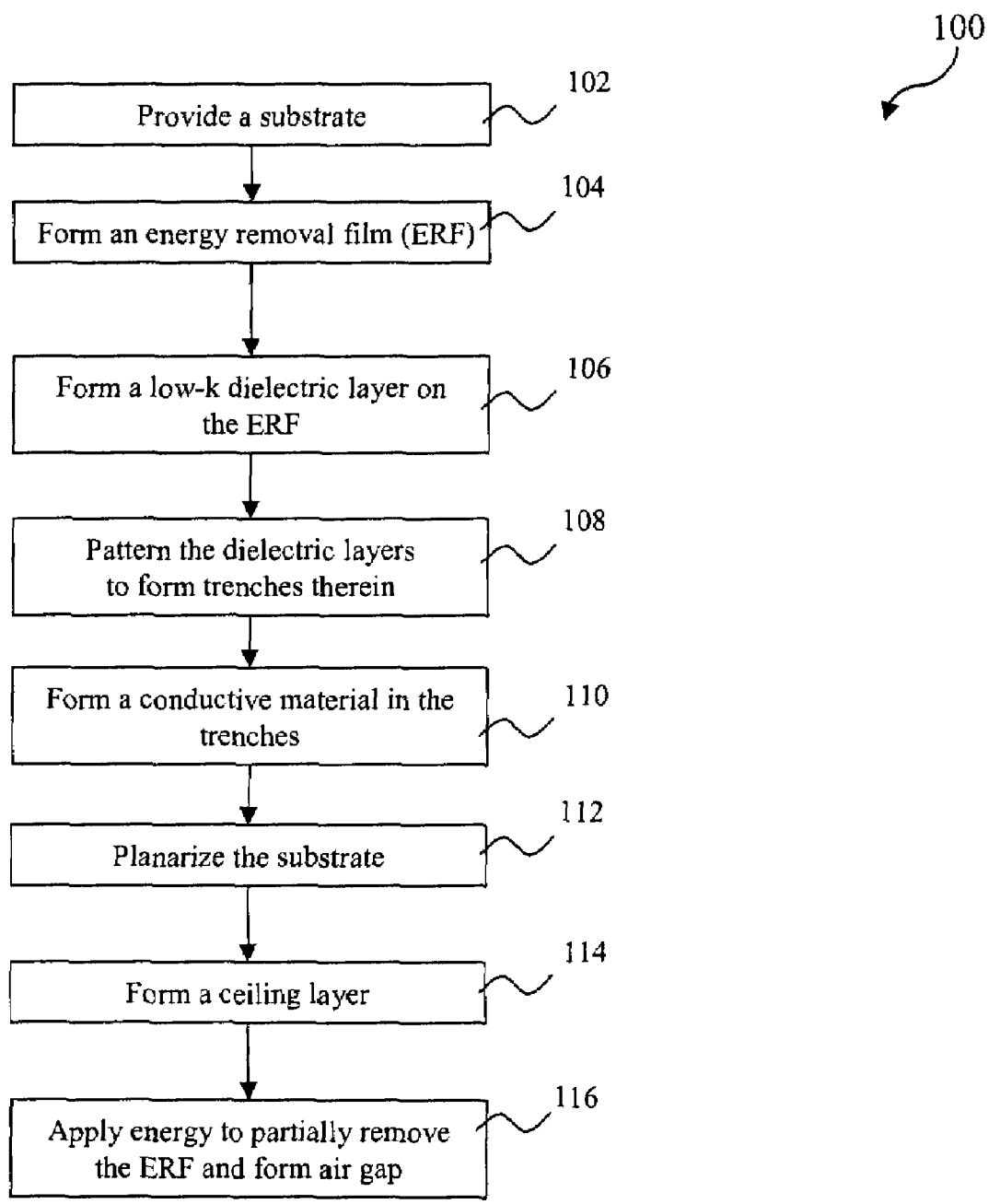
FIG. 1 is a flowchart of one embodiment of a method to form an integrated circuit (IC).

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 to form an integrated circuit according to one or more embodiments of the present invention. FIGS. 2 through 5 illustrate sectional views of an exemplary integrated circuit 200 during various fabrication stages of the method 100. With reference to FIGS. 1 through 5, the method 100 and the exemplary integrated circuit 200 are collectively described below.

Figure 2:
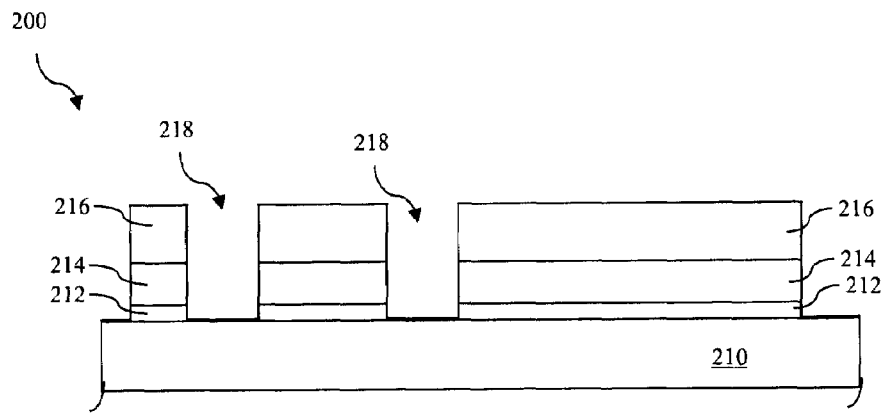
FIGS. 2 through 5 illustrate sectional views of an exemplary integrated circuit during various fabrication stages, made by the method of FIG. 1.

The method 100 begins at step 102 by providing a substrate as shown in FIG. 2. The substrate 210 includes silicon. Alternatively, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. The substrate 210 may include an epitaxial layer. For example, the substrate may have an epitaxial layer overlying a bulk semiconductor. Furthermore, the substrate 210 may include a semiconductor-on-insulator (SOI) structure. For example, the substrate may include a buried oxide (BOX) layer formed by a process such as separation by implanted oxygen (SIMOX). The substrate 210 includes various p-type doped regions and an n-type doped regions, implemented by a process such as ion implantation or diffusion. The substrate 210 may include other functional features such as a resistor, a capacitor, and a gate structure. The substrate 210 may include lateral isolation features provided to separate various devices formed on the substrate 210. The substrate 210 may further include a plurality of patterned dielectric layers and patterned conductive layers combined to form interconnections configured to couple the various p-type and n-type doped regions and the other functional features. In one example, the substrate 210 may include a portion of a multi-layer interconnect (MLI) structure and an inter-level dielectric (ILD).

A material layer 212 such as an etch stop layer (ESL) may be formed on the substrate 210. The ESL may have a proper thickness such that a following etching process used for trench formation is able to properly stop on the ESL with enough etching margin. The material layer 212 may include silicon nitride, silicon oxynitride, silicon carbide, silicon carbide nitride, other suitable material, or a combination thereof.

The method proceeds to step 104 by forming an energy removal film (ERF) 214 on the substrate 210 as shown in FIG. 2, using an energy removal material. The energy removal material is a material decomposable upon being exposed to proper energy such as ultraviolet (UV), X-ray, infrared, visual light, thermal energy, electron-beam (e-beam), and/or other proper energy sources. For example, one energy removal material is decomposable to e-beam with electron energy ranging between about 100 eV and about 500 KeV. The energy removal material includes a photonic decomposable material, a thermal decomposable material and an e-beam decomposable material. In one embodiment, the ERF 214 includes an organic compound. In another embodiment, the ERF includes a silicon-based CxHy compound. The ERF 214 may have a thickness ranging between about 50 angstrom and about 1000 angstrom. The ERF 214 may be formed by a suitable process such as chemical vapor deposition (CVD).

The method proceeds to step 106 by forming a dielectric material layer 216 on the ERF 214 as shown in FIG. 2. The dielectric layer 216 includes silicon oxide, silicon nitride, a low dielectric constant (low k) material, or a combination thereof. The low k material may include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials for examples. A process of forming the dielectric material layer 216 may utilize a CVD or a spin-on coating process. The dielectric layer 216 may include a thickness ranging between about 50 angstrom and about 2000 angstrom. In the present embodiment, the dielectric layer 216 has a porous structure so that air gaps can be properly formed in later steps. In one example, the dielectric layer 216 uses silicon nitride with a proper porous structure and a dielectric constant ranging between about 3 and about 4. The precursor used to form porous silicon nitride by a CVD process may include more organic material to enhance the formation of porosity.

The method proceeds to step 108 by patterning the various dielectric layers including the ERF 214 and the dielectric layer 216 to form a plurality of trenches (or openings) 218 therein as shown in FIG. 2. The plurality of trenches 218 are configured for supporting metal lines. The plurality of trenches 218 may be alternatively used to form vias for vertical interconnects between various metal lines or contacts for vertical interconnects between doped regions in the semiconductor material of the substrate and the metal lines. The trenches 218 may be aligned with the underlying conductive features in the substrate 210 such as metal features in a lower metal layer or alternatively doped regions disposed in the semiconductor material of the substrate 210. A process of forming the trenches 218 may utilize lithography patterning and etching processes know in the art or a new technique to be developed in the future. The material layers to be patterned for trenches may include the dielectric layer 216, the ERF 214, and/or ESL 212. In one example, the material layers are patterned with a sequential process, including photoresist patterning, etching, and photoresist stripping. Further, photoresist patterning includes processing steps of photoresist coating, soft baking, mask aligning, exposing pattern, post-exposure baking, developing photoresist, and hard baking. The etching process applied to the material layers may be dry etching and may be implemented in one or multiple etching steps.

Figure 3:
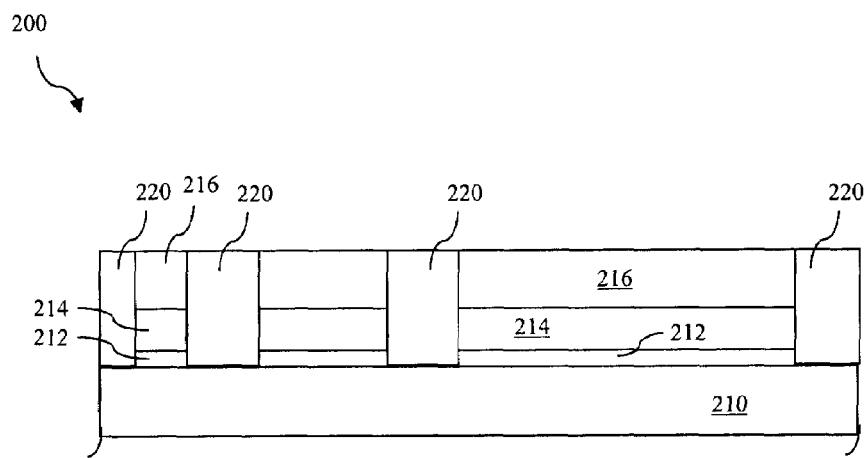

Referring to FIGS. 1 and 3, the method 100 proceeds to step 110 by filling a conductive material in the trenches 218 to form conductive features 220, as shown in FIG. 3. The conductive material may be additionally disposed above and on the dielectric layer 216. The conductive material may include metal or other conductive materials used in multilayer interconnection (MLI). In one embodiment, the conductive material includes copper. In other embodiments, the conductive material may include copper, copper alloy, tungsten, titanium, titanium nitride, or combinations thereof. The conductive features 220 may have a multilayer structure. For example, the conductive features 220 include a barrier/adhesion layer, a copper seed layer, and a bulk copper layer.

The method 100 proceeds to step 112 by planarizing the substrate 210 and removing the conductive material formed on the dielectric layer 216 to achieve a global flatness. The planarizing process includes a chemical mechanical planarizing (chemical mechanical polishing or CMP) process. The planarizing process may alternatively or collectively include an etch back or other suitable process. After the planarization, a metal capping layer may be formed on the conductive feature 220. The metal capping layer may be grew and self-aligned with the conductive features 220 to make extrusion ranging from about 20 angstrom to about 250 angstrom. In various examples, the metal capping layer includes CoWP or Ru.

Figure 4:
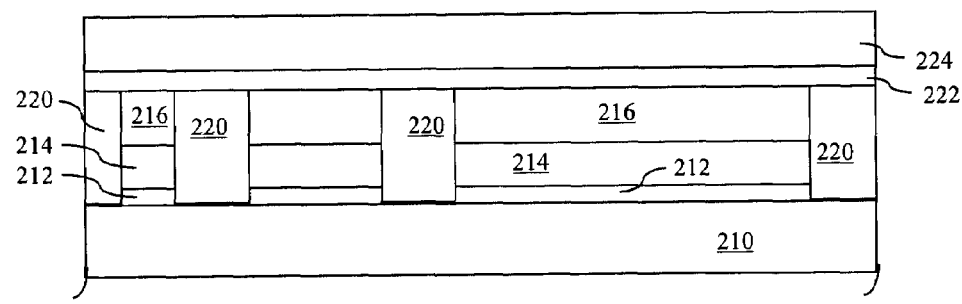

Referring to FIGS. 1 and 4, the method 100 proceeds to step 114 by forming a ceiling layer on the substrate overlying the dielectric layer 216 and the conductive feature 220 after the planarization. The ceiling layer has a porous structure such that the energy removal material in the ERF can be properly removed at a later step of the method 100. In one embodiment, the ceiling layer includes an etch stop layer (ESL) 222 such as silicon nitride, silicon oxynitride, silicon carbide, silicon carbide nitride, other suitable material, or a combination thereof. The ESL layer 222 may be substantially similar to the ESL layer 212 in terms of composition and structure. In another embodiment, the ceiling layer includes a low-k dielectric material layer 224 such as FSG, carbon doped silicon oxide, Black Diamond®, Xerogel, Aerogel, amorphous fluorinated carbon, Parylene, BCB, SiLK, polyimide, and/or other materials as examples. In another embodiment, the ceiling layer includes both an etch stop layer 222 and a low-k dielectric layer 224 in a multilayer structure. The low-k dielectric material layer 224 of the ceiling layer may be substantially similar to the dielectric layer 216 in terms of composition and structure. As shown in FIG. 4 as one example, the etch stop layer 222 is formed on the dielectric layer 216 and the conductive features 220. The etch stop layer 222 may have a thickness ranging between about 10 angstrom and about 500 angstrom. The low-k dielectric layer 224 is additionally formed on the etch stop layer 222 or alternatively formed on the dielectric layer 216. The low-k dielectric layer 224 may have a thickness ranging between about 10 angstrom and about 2000 angstrom.

Figure 5:
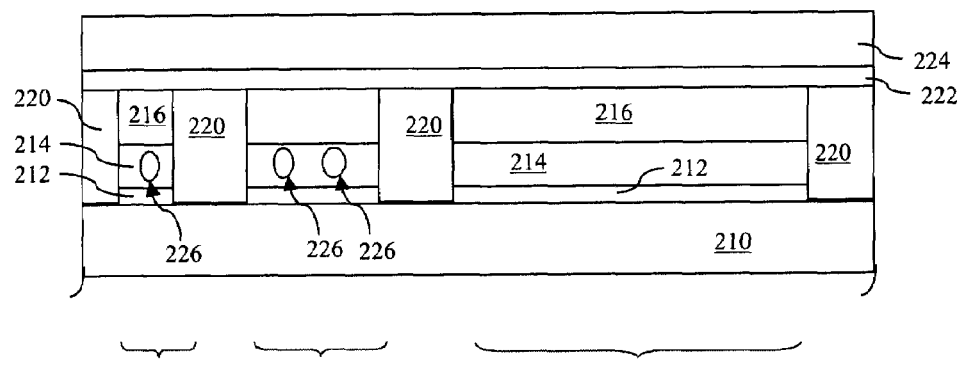

Referring to FIGS. 1 and 5, the method 100 proceeds to step 116 by applying energy to the ERF 214 to partially remove the ERF, resulting in air gaps 226, non-uniformly (in-homogeneously) distributed in the ERF 214. The energy applied to the ERF 214 includes ultraviolet (UV), X-ray, infrared, visual light, thermal energy, electron-beam (e-beam), and/or other proper energy sources. One exemplary energy source applied to the ERF includes e-beam source with electron energy ranging between about 100 eV and about 500 KeV. The energy applied to the ERF 214 may have a certain duration in combination with a certain type of energy so that the ERF 214 can be partially removed to form non-uniform air gaps. In one embodiment, thermal energy is implemented with a temperature ranging between about 100 C and about 600 C and/or a duration from about 1 min to about 20 min. In another embodiment, ultraviolet energy is implemented with a temperature ranging between about 100 C and about 600 C and/or a duration from about 1 min to about 10 min. According to aspects of the present disclosure, the ceiling layer is formed on the dielectric layer 216 and the conductive features 220. The ERF 214, upon being exposed to the applied energy, is partially removed, resulting in a non-uniformly-distributed air gaps as illustrated in FIG. 5. Due to a sealing effect of the ceiling layer to the ERF 214, the formation of the air gaps 226 in the ERF 214 within regions defined by two proximate conductive features 220 with a large spacing, such as region 214a, is substantially reduced. Comparatively, the air gaps are substantially formed in the ERF 214 within regions defined by two proximate conductive features 220 with a small spacing, such as regions 214b and 214c. Accordingly, the air gap collapse is prevented since the collapse is associated with an ERF region with a large metal spacing. Here the large spacing and small spacing are defined relative to the thickness of the ERF 214. For example, if the horizontal distance between two proximate conductive features is about same as or less than the thickness of the ERF 214, the spacing is referred to as a small spacing. If the horizontal distance between two proximate conductive features is much large than the thickness of the ERF 214, the spacing is referred to as a large spacing.

The present disclosure provides a structure and a method making the same in which the air gaps are non-uniformly distributed in the ERF and substantially formed within the regions defined between proximate conductive features with small spacing. The air gaps collapse is substantially reduced or eliminated accordingly.

Figure 6:
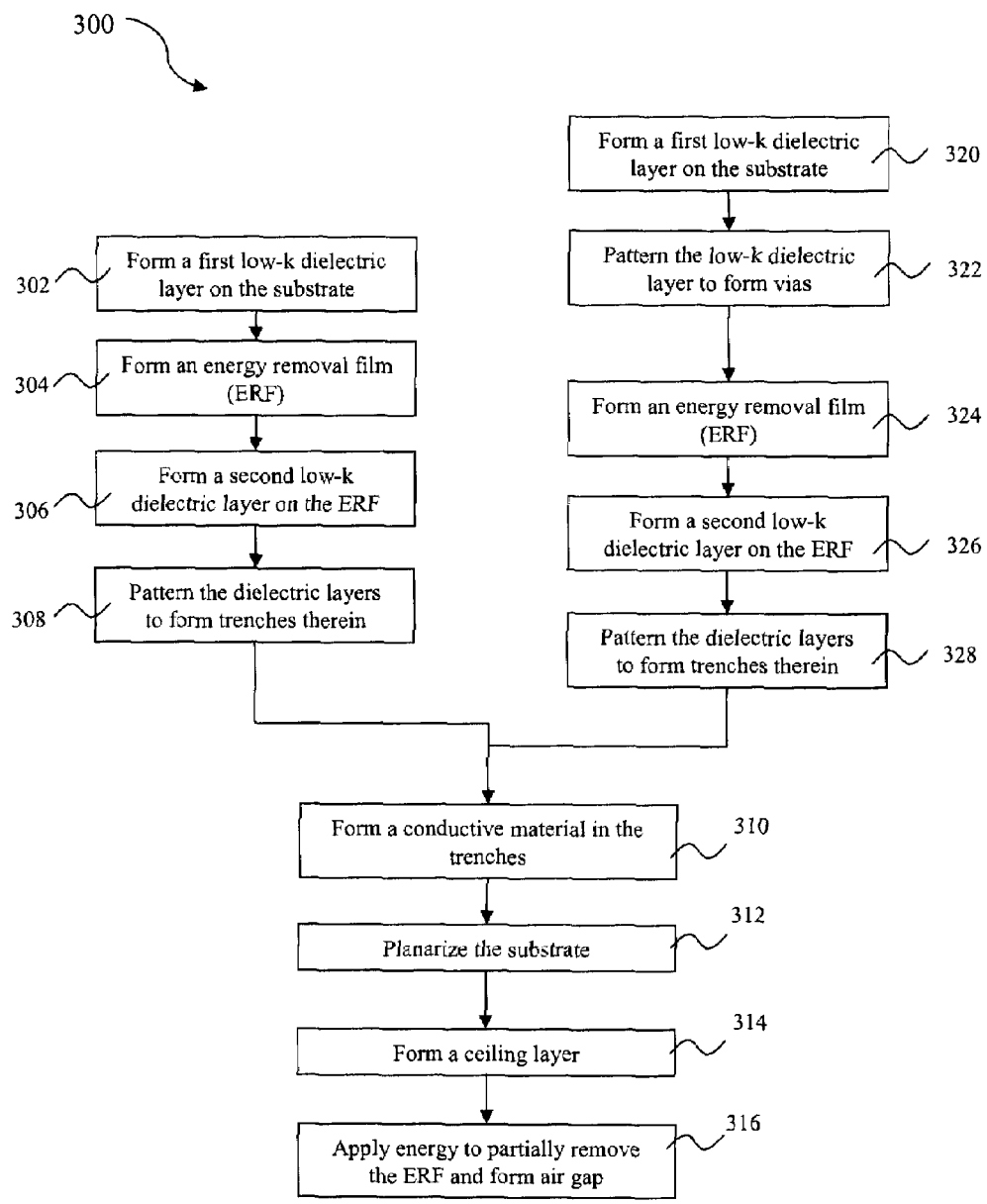
FIG. 6 is a flowchart of another embodiment of a method to form an integrated circuit.

FIG. 6 is a flowchart of another method 300 to form an integrated circuit according to one or more embodiments of the present disclosure. The method 300 may be implemented to form dual damascene interconnect structure in a semiconductor wafer. FIGS. 7 through 11 illustrate sectional views of an exemplary integrated circuit 400 during various fabrication stages of the method 300. With reference to FIGS. 7 through 11, the method 300 and the integrated circuit 400 are collectively described below.

The integrated circuit 400 includes a substrate such as the substrate 210 of FIG. 2. The integrated circuit 400 may further include a portion of the multilayer interconnect structure. As one example, the integrated circuit 400 includes a portion of the multilayer interconnect structure and the interlayer dielectric formed by the method 100 of FIG. 1.

The method 300 begins at step 302 by forming a first dielectric layer on the integrated circuit 400. The first dielectric layer may be the dielectric layer 224 if not formed previously or alternatively a portion of the dielectric layer 224 additionally disposed on at this step. The dielectric layer 224 is substantially similar to the dielectric layer 216 in terms of composition and formation. If the ceiling layer including the etch stop layer 222 and/or the dielectric layer 224 is formed previously during the formation of the underlying air gaps 226 in the ERF 214 and the conductive feature 220, the first dielectric layer may be eliminated for simplified processing flow and reduced manufacturing cost.

Figure 7:
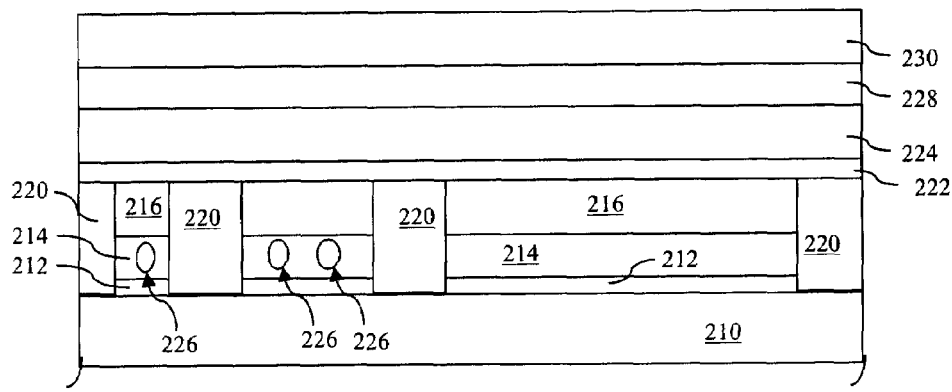
FIGS. 7 through 14 illustrate sectional views of an exemplary integrated circuit during various fabrication stages, made by the method of FIG. 6.

Still referring to FIGS. 6 and 7, the method 300 proceeds to step 304 by forming an energy removal film (ERF) 228 on the integrated circuit 400, as shown in FIG. 7. The ERF 228 includes a material decomposable upon being exposed to energy such as ultraviolet (UV), X-ray, infrared, visual light, thermal energy, electron-beam (e-beam), and/or other proper energy sources. The energy removal material includes photonic decomposable material, thermal decomposable material and e-beam decomposable material. The ERF 228 may be substantially similar to the ERF 214 in terms of composition and formation. In one embodiment, the ERF 228 includes organic compound. In another embodiment, the ERF 228 includes silicon-based CxHy compound. The ERF 228 may have a thickness ranging between about 50 angstrom and about 1000 angstrom. The ERF 228 may be deposited by a suitable process such as CVD.

The method proceeds to step 306 by forming a dielectric material layer 230 on the ERF 228 as shown in FIG. 7. The dielectric material layer 230 includes silicon oxide, silicon nitride, a low k material, or a combination thereof. The dielectric layer 230 may be substantially similar to the dielectric layer 216 and/or the dielectric layer 224 in terms of composition and formation. A process of making the dielectric material layer 230 may utilize CVD or spin-on coating. The dielectric material layer 230 may include a thickness ranging between about 50 angstrom and about 2000 angstrom. The dielectric layer 230 includes a porous structure so that air gaps can be properly formed at a later processing step. In one example, The silicon nitride is used with a proper porous structure and a dielectric constant ranging between about 3 and about 4. The precursor used to form porous silicon nitride in a CVD process includes more organic material to enhance porous formation.

Figure 8:
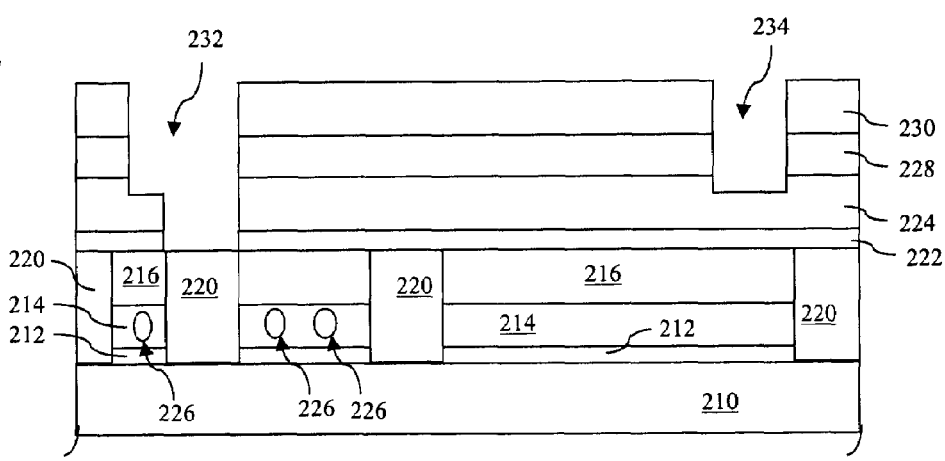

Referring to FIGS. 6 and 8, the method 300 proceeds to step 308 by patterning the various dielectric layers including the dielectric layer 230, the ERF 228, the dielectric layer 224 and the etch stop layer 222 to form a plurality of openings, such as exemplary openings 232 and 234, as shown in FIG. 8. The openings 232 may include both trenches for horizontal metal lines and vias for vertical interconnects. The openings 234 may include only trenches for metal lines. The openings 232 may be aligned to expose underlying conductive features in the substrate 210 such as conductive features 220 in a lower metal layer or alternatively doped regions disposed in the semiconductor material of the substrate 210.

A process of forming the openings 232 and 234 may utilize a lithography patterning and etching processes similar to the lithography patterning process described in the method 100. The formation of the openings 232 and 234 may further utilize various dual damascene techniques. In one embodiment, a via-first dual damascene technique is implemented to form the plurality of openings 232 and 234. In the via-first dual damascene process, vias (such as the lower portions of the openings 232) are first formed using a first lithography patterning process and a first etching process. The trenches (such as the openings 234 and the upper portions of the opening 232) are thereafter formed using a second lithography patterning process and a second etching process. In another embodiment, a trench-first dual damascene technique is implemented to form the plurality of openings 232 and 234. In the trench-first dual damascene process, trenches are first formed using a first lithography patterning process and a first etching process. The vias are thereafter formed using a second lithography patterning process and a second etching process. In another embodiment, trenches and vias are formed in one etching process utilizing a buried etch mask. During the formation of the various aforementioned dielectric material layers, a buried etch layer is formed, disposed in the dielectric material layers and is patterned to form various openings of the buried etch mask layer. The various openings of the buried etch mask layer define the vias regions. A lithography patterning process and an etching process are applied to the dielectric material layers to form both trenches and vias. This technique is also referred to as self-aligned dual damascene technique.

Figure 9:
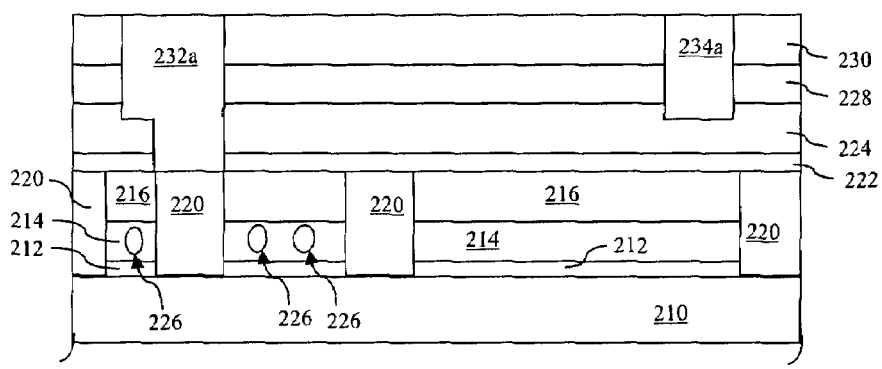

Referring to FIGS. 6 and 9, the method 300 proceeds to step 310 by filling a conductive material in the openings 232 and 234 to form conductive features 232a and 234a, as shown in FIG. 9. The conductive material may be additionally disposed above the dielectric layer 230. The conductive material may include metal or other conductive materials used in multilayer interconnection (MLI). In one embodiment, the conductive material includes copper. In other embodiments, the conductive material may include copper, copper alloy, tungsten, titanium, titanium nitride, or combinations thereof. The conductive features 232a and 234a may have a multilayer structure. For example, the conductive features include a barrier/adhesion layer, a copper seed layer, and a bulk copper layer.

Still referring to FIGS. 6 and 9, the method 300 proceeds to step 312 by planarizing the integrated circuit 400 and removing the conductive material disposed on the dielectric layer 230 to achieve a global flatness. The planarizing process includes CMP. The planarizing process may alternatively or collectively include an etch back or other suitable process. In one embodiment, a metal capping layer may be formed on the conductive feature 232a and 234a after the planarization. The metal capping layer may be grew and self-aligned with the conductive features to mask extrusion ranging between about 20 angstrom and about 250 angstrom. In various examples, the metal capping layer may include CoWP or Ru.

Figure 10:
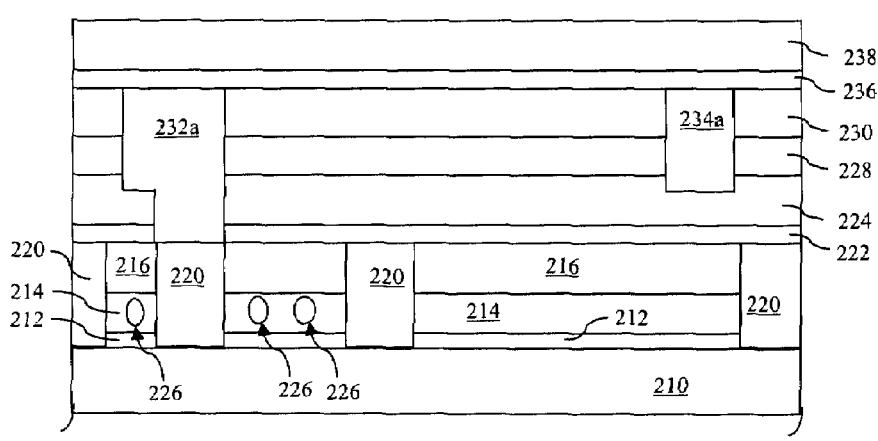

Referring to FIGS. 6 and 10, the method 300 proceeds to step 314 by forming a ceiling layer on the substrate overlying the dielectric layer 230 and the conductive features 232a/

234a. The ceiling layer has a porous structure such that the energy removal material in the ERF can be properly removed at a later removal step. In one embodiment, the ceiling layer includes an ESL such as silicon nitride, silicon oxynitride, silicon carbide, silicon carbide nitride, other suitable material, or a combination thereof. The ESL may be substantially similar to the ESL layer 212 in terms of composition and structure. In another embodiment, the ceiling layer includes a low-k dielectric material layer such as FSG, carbon doped silicon oxide, Black Diamond®, Xerogel, Aerogel, amorphous fluorinated carbon, Parylene, BCB, SiLK, polyimide, and/or other materials as examples. The low-k dielectric material in the ceiling layer may be substantially similar to the low-k dielectric layer 216 in terms of composition and structure. In another embodiment, the ceiling layer includes both an etch stop layer and a low-k dielectric layer in a multilayer structure. As one example shown in FIG. 10, an etch stop layer 236 is formed on the dielectric layer 230 and the conductive features 232 and 234. The etch stop layer 236 may have a thickness ranging between about 10 angstrom and about 500 angstrom in one example. A low-k dielectric layer 238 is additionally formed on the etch stop layer 236 or alternatively formed on the dielectric layer 230. The second low-k dielectric layer may have a thickness ranging between about 10 angstrom and about 2000 angstrom in one example.

Figure 11:
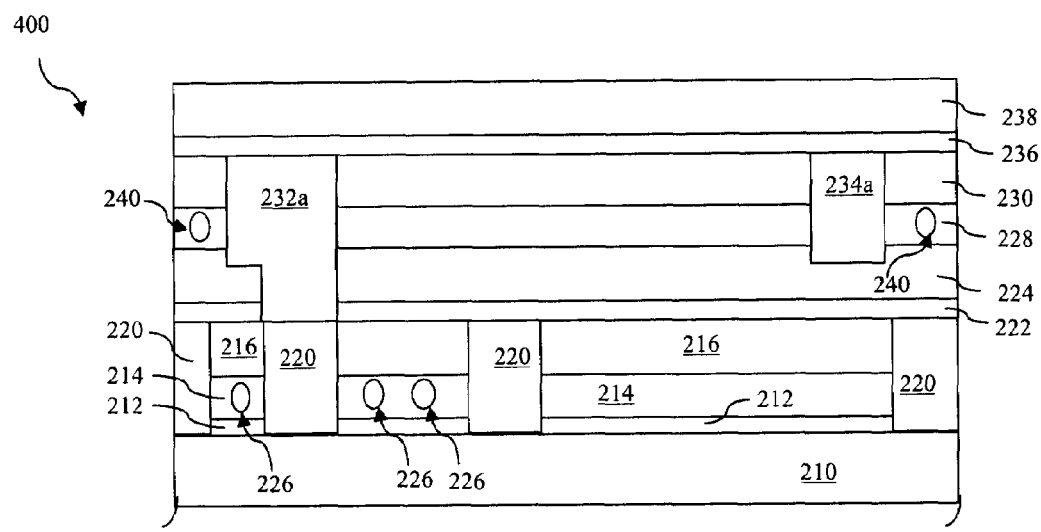

Referring to FIGS. 6 and 11, the method 300 proceeds to step 316 by applying energy to the ERF 228 to partially remove the ERF, resulting in air gaps 240 non-uniformly distributed in the ERF 228. The energy applied to the ERF 228 includes ultraviolet (UV), X-ray, infrared, visual light, thermal energy, electron-beam (e-beam), and/or other proper energy sources. The energy applied to the ERF 228 may be substantially similar to the energy applied to the ERF 214 in step 118 of the method 100. Since a ceiling layer is formed on the ERF 228, the dielectric layer 230, and the conductive features 232/234 according to aspects of the present disclosure, the ERF 228 is partially removed when exposed to the applied energy, resulting in air gaps distributed non-uniformly as illustrated in FIG. 11, similar to the air gaps 226 formed by the method 100. The air gaps are substantially formed in the ERF 228 within regions defined by the conductive features 232/234 with small spacing. Accordingly, the air gap collapse is prevented.

The present disclosure provides a structure and a method making the same in which the air gaps are substantially distributed within the ERF regions defined between proximate conductive features with small spacing. The air gaps collapse is substantially reduced accordingly.

The foregoing method 300 may have various embodiments. Another embodiment of the method 300 begins from step 320 and ends at step 316 as shown in FIG. 6. FIGS. 12 through 14 and 9 through 11 illustrate sectional views of an exemplary integrated circuit 400 during various fabrication stages of the method 300 in this embodiment. With reference to FIG. 6, FIGS. 12 through 14 and 9 through 1, the second embodiment of the method 300 and the integrated circuit 400 are collectively described below. Some details regarding processing and structure may be skipped for simplicity if they are similar to those described in the first embodiment of the method 300.

Figure 12:
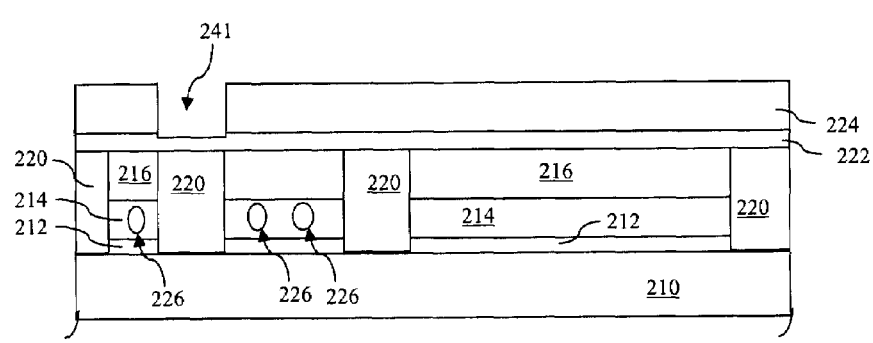

Referring to FIG. 12, the method 300 may begin at step 320 by forming a first dielectric layer 224 on the integrated circuit 400, substantially similar to those of the step 302. Alternatively, the first dielectric layer 224 may be formed completely or partially before the underlying ERF 214 is exposed to form the air gaps 226. The dielectric layer 224 is substantially similar to the dielectric layer 216 in terms of composition and formation. The ESL 222 may be additionally or alternatively formed as shown in FIG. 12. If the ESL 222 and/or the dielectric layer 224 are formed before the application energy to form the air gaps 226, then this step may be eliminated with simplified processing flow and reduced manufacturing cost.

Still referring to FIGS. 6 and 12, the method proceeds to step 322 by patterning the dielectric material layers including the low-k dielectric layer 224 and the ESL 222 in this embodiment in this embodiment, to form a plurality of openings 241 as shown in FIG. 12. In one example, the ESL 222 is only partially removed within the plurality of openings 241 in an etching process to remove the low-k dielectric layer 224. The openings 241 are configured and defined for vias for vertical interconnect in the multilayer interconnect structure.

Figure 13:
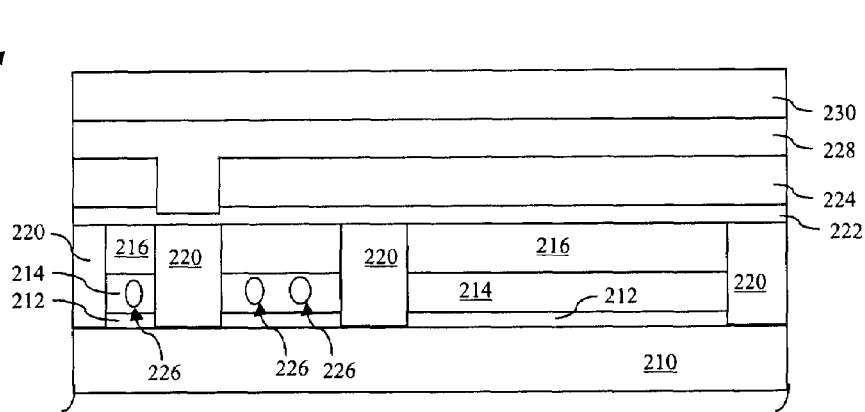

Referring to FIGS. 6 and 13, the method proceeds to step 324 by forming an energy removal film (ERF) 228 on the substrate, as shown in FIG. 13. The ERF 228 is disposed on the dielectric layer 224 and filled in the openings 241. The ERF 228 may have a thickness ranging between about 50 angstrom and about 1000 angstrom from the top surface of the dielectric layer 224.

Still referring to FIGS. 6 and 13, the method proceeds to step 326 by forming a dielectric material layer 230 on the ERF 228 as shown in FIG. 13. The dielectric layer 230 includes silicon oxide, silicon nitride, a low dielectric constant (low k) material, or a combination thereof. The dielectric layer 230 may include a thickness ranging between about 50 angstrom and about 2000 angstrom. The dielectric layer 230 includes a porous structure so that air gaps can be properly formed at a later processing step. In one example, the silicon nitride/carbide is used with a proper porous structure and a dielectric constant ranging between about 2.5 and about 4. The precursor used to form porous silicon nitride/carbide by a CVD process includes more organic material to enhance the porosity formation.

Figure 14:
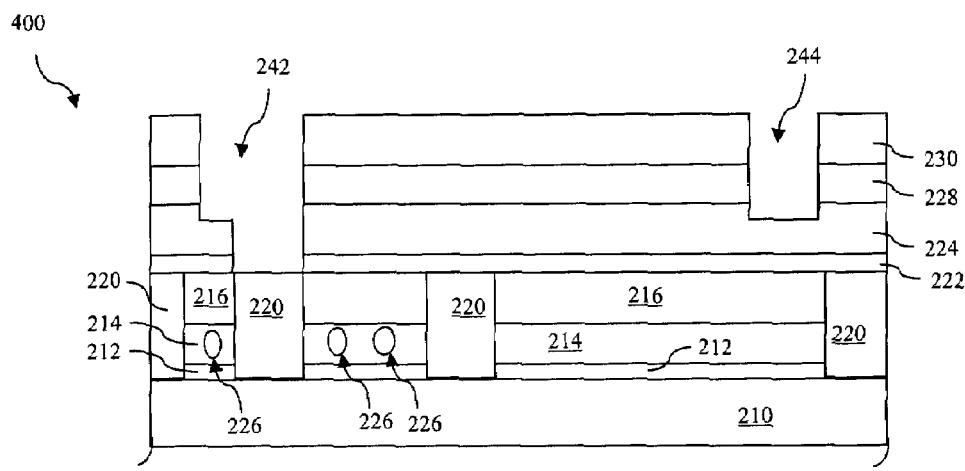

Referring to FIGS. 6 and 14, the method proceeds to step 328 by patterning the various dielectric layers, which may include the dielectric layer 230, the ERF 228 and the dielectric layer 224, to form a plurality of openings, such as exemplary openings 242 and 244 as shown in FIG. 14. The openings 242/244 are designed for metal lines. A process of forming the openings 242 and 244 may utilize a lithography patterning and etching processes know in the art, similar to the lithography patterning process described in the method 100.

The method 300 in the second embodiment further include steps 310 through 316 as shown in FIG. 6. The processing step 310 to step 316 of the method 300 in the second embodiment are substantially similar to the corresponding steps of the method 300 in the first embodiment, therefore the description thereof is eliminated for simplicity. The integrated circuit 400 made thereby is further illustrated as sectional views in FIGS. 9 through 11 with respect to the steps 310 through 316.

The present disclosure may include other variations, extensions, and embodiments without departure of the spirit of the invention. For example, the aforementioned lithography processes may only present a subset of processing steps associated with a lithography patterning technique. The lithography process may further include other steps such as cleaning and baking in a proper sequence. The lithography processes may have other variations. For example, an anti-reflective coating (ARC) may be disposed overlying the resist layer, referred to as top ARC (TAR). A resist layer used in various lithography processing steps may include a chemical amplification resist (CA resist). The CA resist includes a photosensitive material, referred to as photoacid generator (PAG). A photon induces decomposition of PAG and forms a small amount of acid, which further induces a cascade of chemical transformations in the resist layer, typically during a post-exposure bake (PEB) step.

Other damascene techniques may be used with the energy removal material and the ceiling layer according to the aspects of the present disclosure, in order to form a multilayer interconnect structure with introduced air gaps in the energy removal material, collectively reduced dielectric constant and reduced air gap collapse effect.

The formation, configuration, and composition of each feature may be different in various other embodiments, for manufacturing compatibility, cost and/or other advantages. Three particular examples of the method 100 are provided below as further illustrations. In one example, the ERF 214 has a thickness ranging between about 50 angstrom and bout 1000 angstrom. The dielectric layer 216 has a thickness ranging between about 50 angstrom and about 2000 angstrom. Only the ESL 222 is used as the ceiling layer and has a thickness ranging between about 10 angstrom and about 500 angstrom. The application of energy to the ERF 214 includes a thermal curing process with a curing temperature ranging from about 100 C to about 600 C and a duration from about 1 minute to about 20 minutes. In second example, the ERF 214 has a thickness ranging between about 50 angstrom and bout 1000 angstrom. The dielectric layer 216 has a thickness ranging between about 50 angstrom and about 2000 angstrom. Both the ESL 222 and dielectric layer 224 are employed as the ceiling layer. The ESL 222 has a thickness ranging between about 20 angstrom and about 500 angstrom. The dielectric layer 224 has a thickness ranging between about 50 angstrom and about 2000 angstrom. The application of energy to the ERF 214 includes an UV curing process with a curing temperature ranging from about 100 C to about 600 C and a duration from about 1 minute to about 10 minutes. In third example, the ERF 214 has a thickness ranging between about 50 angstrom and bout 1000 angstrom. The dielectric layer 216 has a thickness ranging between about 50 angstrom and about 2000 angstrom. A metal capping layer such as CoWP or Ru is formed on the top of metal features 220. The metal capping layer may be formed by a self-align growth to make a metal extrusion from about 20 angstrom to about 250 angstrom. Only the dielectric layer 224 is employed as the ceiling layer. The dielectric layer 224 has a thickness ranging between about 10 angstrom and about 2000 angstrom. The application of energy to the ERF 214 includes an UV curing process with a curing temperature ranging from about 100 C to about 600 C and a curing duration from about 1 minute to about 10 minutes.

As to the method 300 and the integrated circuit 400, a particular example is provided below. In this example with reference to FIG. 11, the ERF 214 has a thickness ranging between about 50 angstrom and bout 1000 angstrom. The dielectric layer 216 has a thickness ranging between about 50 angstrom and about 2000 angstrom. A metal capping layer such as CoWP or Ru is formed on the top of metal features 220. The metal capping layer may be formed by a self-align growth to make a metal extrusion from about 20 angstrom to about 250 angstrom. Only the dielectric layer 224 is employed as the ceiling layer. The dielectric layer 224 has a thickness ranging between about 10 angstrom and about 2000 angstrom. The application of energy to the ERF 214 includes an UV curing process with a curing temperature ranging from about 100 C to about 600 C and a curing duration ranging from about 1 minute to about 10 minutes. The ERF 228 has a thickness ranging between about 50 angstrom and bout 1000 angstrom. The dielectric layer 230 has a thickness ranging between about 50 angstrom and about 2000 angstrom. A metal capping layer such as CoWP or Ru is formed on the top of metal features 232/234. The metal capping layer may be formed by a self-align growth to make a metal extrusion from about 20 angstrom to about 250 angstrom. Only the dielectric layer 238 is employed as the ceiling layer. The dielectric layer 238 has a thickness ranging between about 10 angstrom and about 2000 angstrom. The application of energy to the ERF 228 includes an UV curing process with a curing temperature ranging from about 100 C to about 600 C and a duration from about 1 minute to about 10 minutes.

Thus, the present disclosure provides a method for fabricating an integrated circuit. The method includes forming an energy removable film (ERF) on a substrate; forming a first dielectric layer on the ERF; patterning the ERF and first dielectric layer to form a trench in the ERF and the first dielectric layer; filling a conductive material in the trench; forming a ceiling layer on the first dielectric layer and conductive material filled in the trench; and applying energy to the ERF to form air gaps in the ERF after the forming of the ceiling layer.

The disclosed method includes various embodiments. The patterning of the ERF and first dielectric layer may include coating a resist layer on the first dielectric layer; forming a resist opening in the resist layer exposing the first dielectric layer within the resist opening, utilizing a lithography process; and etching the first dielectric layer and ERF within the resist opening. The method may further include planarizing the substrate by a chemical mechanical polishing (CMP) process after the filling of the conductive material and before the forming of the ceiling layer. The filling of the conductive material in the trench may include forming a barrier layer on sidewalls of the trench; forming a copper seed layer on the barrier layer; and forming a copper layer on the copper seed layer to fill the trench utilizing a plating process. The method may further include forming a second dielectric layer on the ceiling layer before the applying of the energy before applying energy to the ERF. The first dielectric layer may include a low-k material having a dielectric constant less than that of silicon oxide. The applying of energy to the ERF may include utilizing one type of energy selected from the group consisting of thermal energy, X-ray, ultraviolet (UV) light, infra-red light, and a combination thereof. The forming of the ceiling layer may include forming a material layer selected from the group consisting of an etch stop layer, a low-k dielectric material layer, and combination thereof. The forming of the ceiling layer may include forming a porous material layer. The forming of the ceiling layer may include forming a porous silicon nitridecarbide layer with a dielectric constant ranging from about 2.5 to about 4. The forming of the ERF may include forming a material selected from the group consisting of a photonic decomposable material, a thermal decomposable material, an e-beam decomposable material, and a combination thereof.

The present disclosure also provides a method including: forming an energy removable film (ERF) on a substrate; forming a low-dielectric-constant (low-k) dielectric layer on the ERF; patterning the ERF and low-k dielectric layer to form a plurality of trenches in the ERF and the low-k dielectric layer; filling a conductive material in the plurality of trenches; applying a chemical mechanical polishing (CMP) process to the conductive material; forming a ceiling layer of a porous structure on the low-k dielectric layer and conductive material filled in the plurality of trenches; and after the forming of the ceiling layer, applying energy to the ERF to form air gaps in the ERF. The forming of the ceiling layer may include forming a material layer selected from the group consisting of an etch stop layer, a low-k dielectric layer, and combinations thereof.

The present disclosure also provides an integrated circuit. The integrated circuit include an energy removal film (ERF) disposed on a substrate; a dielectric layer disposed on the ERF; a plurality of conductive features filled in the ERF and the dielectric layer; and a ceiling layer disposed on the dielectric layer and the plurality of conductive features, wherein the ERF layer includes air gaps inhomogeneously distributed such that a portion of the ERF having a narrower spacing between two of the plurality of conductive features has a higher air gap density than that of a portion of the ERF having a larger spacing.

The disclosed circuit has various embodiments. The dielectric layer and the ceiling layer each may include a porous structure. The dielectric layer may include a porous structure with a porosity ranging between about 0.5% and about 80%. The dielectric layer may include a material selected from the group consisting of a low-dielectric-constant (low-k) material, carbon-doped silicon oxide, an organic insulating material, a porogened insulating material, and combinations thereof. The ceiling layer may include a material selected from the group consisting of an etch stop layer, a low-k dielectric layer, and a combination thereof. The ceiling layer may include a material selected from the group consisting of silicon nitride, carbon-doped silicon nitride, nitrogen doped silicon carbide, oxygen doped silicon carbide, SixCyNzHj, and combinations thereof. The ERF may include a material selected from the group consisting of a photonic decomposable material, a thermal decomposable material, an e-beam decomposable material, and a combination thereof. The ERF may include an organic compound. The ERF may include a silicon-based organic compound.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for fabricating an integrated circuit, comprising:
   forming an energy removable film (ERF) on a substrate;
   forming a first dielectric layer on the ERF, wherein the first dielectric layer comprises a low-k material having a dielectric constant less than that of silicon oxide;
   patterning the ERF and first dielectric layer to form a trench in the ERF and the first dielectric layer;
   filling a conductive material in the trench;
   forming a ceiling layer on the first dielectric layer and conductive material filled in the trench; and
   applying energy to form air gaps in the ERF after forming the ceiling layer.

2. The method of claim 1, further comprising planarizing the substrate by a chemical mechanical polishing (CMP) process after the filling of the conductive material and before the forming of the ceiling layer.

3. The method of claim 1, further comprising forming a second dielectric layer on the ceiling layer before the applying of the energy before applying energy to the ERF.

4. The method of claim 1, wherein the applying of energy to the ERF comprises utilizing one type of energy selected from the group consisting of thermal energy, X-ray, ultraviolet (UV) light, infra-red light, and a combination thereof.

5. The method of claim 1, wherein the forming of the ceiling layer comprises forming a material layer selected from the group consisting of an etch stop layer, a low-k dielectric material layer, and combination thereof.

6. The method of claim 1, wherein the forming of the ceiling layer comprises forming a porous material layer.

7. The method of claim 1, wherein the forming of the ceiling layer comprises forming a porous silicon nitride or carbide layer with a dielectric constant ranging from about 2.5 to about 4.

8. The method of claim 1, wherein the forming of the ERF comprises forming a material selected from the group consisting of a photonic decomposable material, a thermal decomposable material, an e-beam decomposable material, and a combination thereof.

9. A method comprising:
   forming an energy removable film (ERF) on a substrate;
   forming a low-dielectric-constant (low-k) layer on the ERF;
   patterning the ERF and low-k layer to form a plurality of trenches in the ERF and the first dielectric layer;
   filling a conductive material in the plurality of trenches;
   applying a chemical mechanical polishing (CMP) process to the conductive material;
   forming a ceiling layer of a porous structure on the low-k layer and conductive material filled in the plurality of trenches; and
   after the forming of the ceiling layer, applying energy to the ERF to form air gaps in the ERF.

10. The method of claim 9, wherein the applying of energy to the ERF comprises utilizing one type of energy selected from the group consisting of thermal energy, X-ray, ultraviolet (UV) light, infra-red light, and a combination thereof.

11. An integrated circuit comprising;
    an energy removal film (ERF) disposed on a substrate;
    a dielectric layer disposed on the ERF;
    a plurality of conductive features filled in the ERF and the dielectric layer; and
    a ceiling layer disposed on the dielectric layer and the plurality of conductive features, wherein the ERF layer includes air gaps inhomogeneously distributed such that a portion of the ERF having a narrower spacing between two of the plurality of conductive features has a higher air gap density than that of a portion of the ERF having a larger spacing.

12. The integrated circuit of claim 11, wherein the dielectric layer and the ceiling layer each comprises a porous structure.

13. The integrated circuit of claim 11, wherein the dielectric layer comprises a porous structure with a porosity ranging between about 0.5% and about 80%.

14. The integrated circuit of claim 11, wherein the dielectric layer comprises a material selected from the group consisting of a low-dielectric-constant (low-k) material, carbon-doped silicon oxide, an organic insulating material, a porogened insulating material, and combinations thereof.

15. The integrated circuit of claim 11, wherein the ceiling layer comprises a material selected from the group consisting of an etch stop layer, a low-k dielectric layer, and a combination thereof.

16. The integrated circuit of claim 11, wherein the ceiling layer comprises a material selected from the group consisting of silicon nitride, carbon-doped silicon nitride, nitrogen doped silicon carbide, oxygen doped silicon carbide, Six-CyNzHj, and combinations thereof.

17. The integrated circuit of claim 11, wherein the ERF comprises a material selected from the group consisting of a photonic decomposable material, a thermal decomposable material, an e-beam decomposable material, and a combination thereof.

18. The integrated circuit of claim 11, wherein the ERF comprises an organic compound.

19. The integrated circuit of claim 11, wherein the ERF comprises a silicon-based organic compound.

* * * * *